United States Patent
Liu et al.

(10) Patent No.: US 9,214,383 B2
(45) Date of Patent: Dec. 15, 2015

(54) METHOD OF SEMICONDUCTOR INTEGRATED CIRCUIT FABRICATION

(71) Applicant: Taiwan Semiconductor Manufacturing Company, Ltd., Hsin-Chu (TW)

(72) Inventors: Wen-Jiun Liu, Zhunan Township, Miaoli County (TW); Chien-An Chen, Zhubei (TW); Ya-Lien Lee, Baoshan Township, Hsinchu County (TW); Hung-Wen Su, Jhubei (TW); Minghsing Tsai, Chu-Pei (TW); Syun-Ming Jang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 107 days.

(21) Appl. No.: 13/745,060

(22) Filed: Jan. 18, 2013

(65) Prior Publication Data

US 2014/0203437 A1    Jul. 24, 2014

(51) Int. Cl.
*H01L 23/48*    (2006.01)
*H01L 21/00*    (2006.01)
*H01L 21/768*   (2006.01)
*H01L 23/532*   (2006.01)

(52) U.S. Cl.
CPC ........ *H01L 21/768* (2013.01); *H01L 21/76885* (2013.01); *H01L 23/53233* (2013.01); *H01L 23/53238* (2013.01); *H01L 23/53252* (2013.01); *H01L 21/76852* (2013.01); *H01L 2924/0002* (2013.01)

(58) Field of Classification Search
CPC .............. H01L 23/52; H01L 23/53223; H01L 23/53266; H01L 23/53209; H01L 21/768
USPC .......... 257/363, 306, 310, 296, 753; 438/238, 438/627, 597, 118
See application file for complete search history.

(56) References Cited

U.S. PATENT DOCUMENTS

| | | | |
|---|---|---|---|
| 2006/0138668 A1* | 6/2006 | Su et al. | 257/762 |
| 2008/0233745 A1* | 9/2008 | Chang et al. | 438/687 |
| 2011/0076390 A1* | 3/2011 | Cerio et al. | 427/96.8 |

* cited by examiner

*Primary Examiner* — Robert Bachner
*Assistant Examiner* — Moin Rahman
(74) *Attorney, Agent, or Firm* — Haynes and Boone, LLP

(57) ABSTRACT

A method of fabricating a semiconductor integrated circuit (IC) is disclosed. The method includes providing a substrate. A patterned adhesion layer is formed on the substrate. A metal layer is deposited on the patterned adhesion layer. An elevated temperature thermal process is applied to agglomerate the metal layer to form a self-forming-metal-feature (SFMF) and a dielectric layer is deposited between SFMFs.

20 Claims, 6 Drawing Sheets

METHOD OF SEMICONDUCTOR INTEGRATED CIRCUIT FABRICATION

BACKGROUND

The semiconductor integrated circuit (IC) industry has experienced exponential growth. Technological advances in IC design and material have produced generations of ICs where each generation has smaller and more complex circuits than previous generation. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. When a semiconductor device such as a metal-oxide-semiconductor field-effect transistor (MOSFET) is scaled down through various technology nodes, interconnects of conductive lines and associated dielectric materials that facilitate wiring between the transistors and other devices play a more important role in IC performance improvement. Although existing methods of fabricating IC devices have been generally adequate for their intended purposes, they have not been entirely satisfactory in all respects. For example, challenges rise to develop a more robust metal line formation for interconnection structures. It is desired to have improvements in this area

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Figure 1:
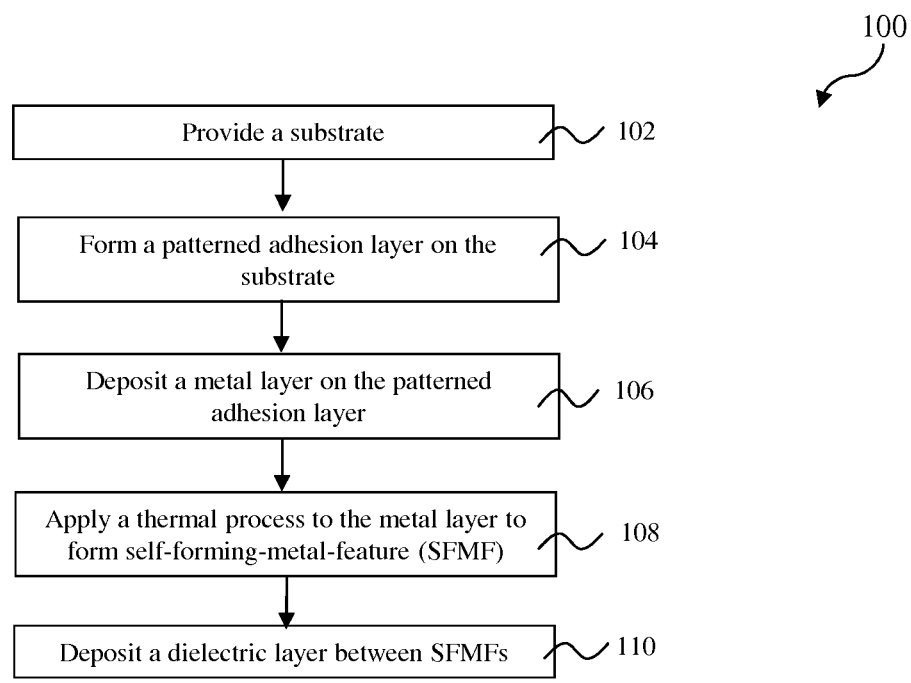
FIG. 1 is a flowchart of an example method for fabricating a semiconductor integrated circuit (IC) constructed according to various aspects of the present disclosure.

FIG. 1 is a flowchart of one embodiment of a method 100 of fabricating one or more semiconductor devices according to aspects of the present disclosure. The method 100 is discussed in detail below, with reference to a semiconductor device 200 shown in FIGS. 2 to 6 for the sake of example.

Figure 2:
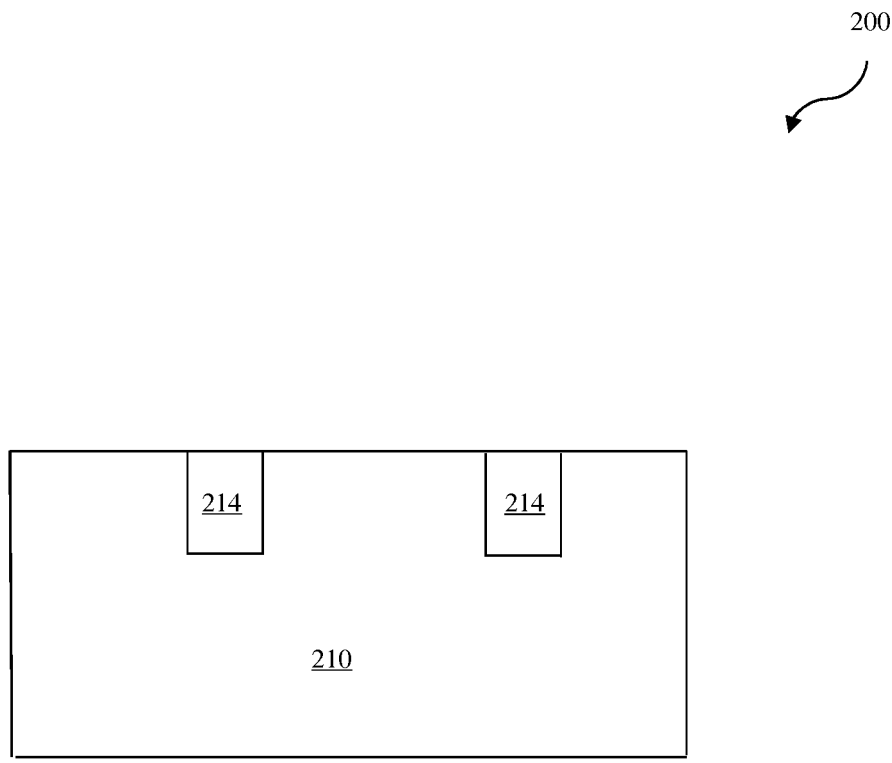
FIGS. 2 to 6 are cross-sectional views of an example semiconductor IC device at fabrication stages constructed according to the method of FIG. 1.

Referring to FIGS. 1 and 2, the method 100 begins at step 102 by providing a substrate 210. The substrate 210 includes silicon. Alternatively or additionally, the substrate 210 may include other elementary semiconductor such as germanium. The substrate 210 may also include a compound semiconductor such as silicon carbide, gallium arsenic, indium arsenide, and indium phosphide. The substrate 210 may include an alloy semiconductor such as silicon germanium, silicon germanium carbide, gallium arsenic phosphide, and gallium indium phosphide. In one embodiment, the substrate 210 includes an epitaxial layer. For example, the substrate 210 may have an epitaxial layer overlying a bulk semiconductor. Furthermore, the substrate 210 may include a semiconductor-on-insulator (SOI) structure. For example, the substrate 210 may include a buried oxide (BOX) layer formed by a process such as separation by implanted oxygen (SIMOX) or other suitable technique, such as wafer bonding and grinding.

The substrate 210 may also include various p-type doped regions and/or n-type doped regions, implemented by a process such as ion implantation and/or diffusion. Those doped regions include n-well, p-well, light doped region (LDD), heavily doped source and drain (S/D), and various channel doping profiles configured to form various integrated circuit (IC) devices, such as a complimentary metal-oxide-semiconductor field-effect transistor (CMOSFET), imaging sensor, and/or light emitting diode (LED). The substrate 210 may further include other functional features such as a resistor or a capacitor formed in and on the substrate.

The substrate 210 may also include various isolation features. The isolation features separate various device regions in the substrate 210. The isolation features include different structures formed by using different processing technologies. For example, the isolation features may include shallow trench isolation (STI) features. The formation of a STI may include etching a trench in the substrate 210 and filling in the trench with insulator materials such as silicon oxide, silicon nitride, or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features.

The substrate 210 may also include gate stacks formed by dielectric layers and electrode layers. The dielectric layers may include an interfacial layer (IL) and a high-k (HK) dielectric layer deposited by suitable techniques, such as chemical vapor deposition (CVD), atomic layer deposition (ALD), physical vapor deposition (PVD), thermal oxidation, combinations thereof, or other suitable techniques. The electrode layers may include a single layer or multi layers, such as metal layer, liner layer, wetting layer, and adhesion layer, formed by ALD, PVD, CVD, or other suitable process.

The substrate 210 may also include a plurality of inter-level dielectric (ILD) layers and conductive features integrated to form an interconnect structure configured to couple the various p-type and n-type doped regions and the other functional features (such as gate electrodes), resulting a functional integrated circuit. In one example, the substrate 210 may include a portion of the interconnect structure and the interconnect structure includes a multi-layer interconnect (MLI) structure and an ILD layer integrated with a MLI structure, providing an electrical routing to couple various devices in the substrate 210 to the input/output power and signals. The interconnect structure includes various metal lines, contacts and via features (or via plugs). The metal lines provide horizontal electrical routing. The contacts provide vertical connection between silicon substrate and metal lines while via features provide vertical connection between metal lines in different metal layers.

The substrate 210 includes a device component 214. In one embodiment, the device component 214 includes conductive features. The conductive feature 214 may include a portion of the interconnect structure. For example, the conductive features 214 include contacts, metal vias, or metal lines. The conductive features 214 may be formed by a procedure including lithography, etching and deposition. In another embodiment, the conductive features 214 include electrodes, capacitors, resistors or a portion of a resistor. Alternatively, the conductive features 214 may include doped regions (such as sources or drains), or gate electrodes. In another example, the conductive features 214 are silicide features disposed on respective sources, drains or gate electrodes. The silicide feature may be formed by a self-aligned silicide (salicide) technique.

Figure 3:
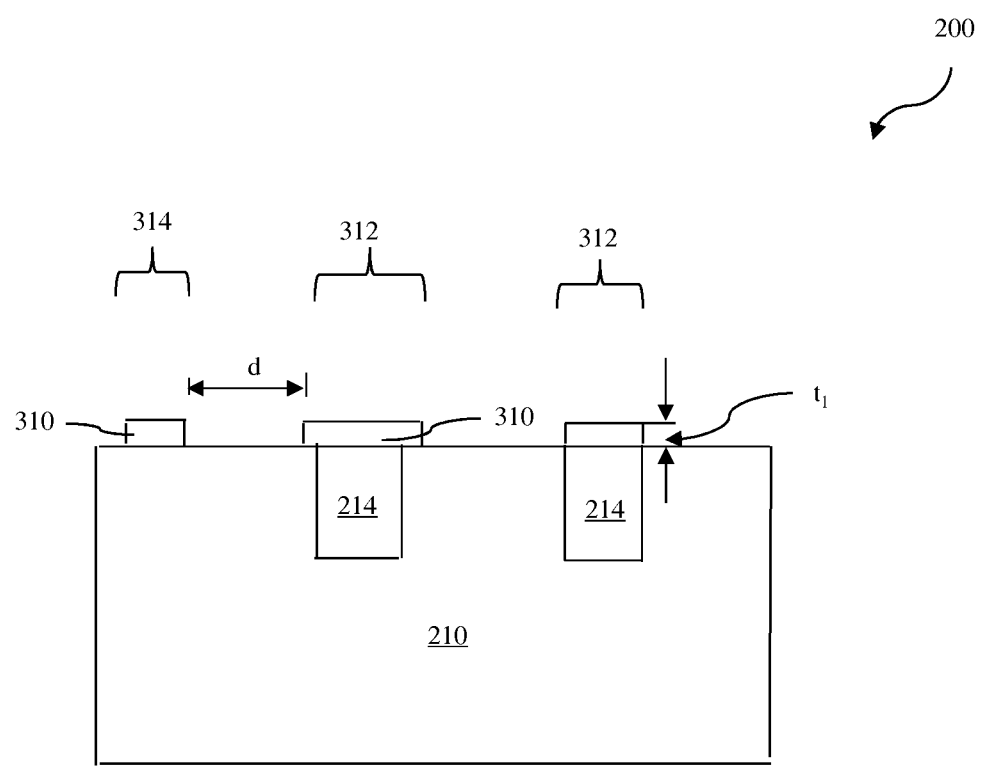

Referring to FIGS. 1 and 3, the method 100 proceeds to step 104 by forming a patterned adhesion layer 310 with a first thickness ($t_1$) above the substrate 210. The patterned adhesion layer 310 may include cobalt (Co), ruthenium (Ru), manganese (Mn), tantalum (Ta), tantalum nitride (TaN), titanium (Ti), titanium nitride (TiN), tungsten (W), or other suitable material. The patterned adhesion layer 310 may be deposited by physical vapor deposition (PVD), chemical vapor deposition (CVD), metal-organic chemical vapor deposition (MOCVD), atomic layer deposition (ALD), or other suitable processes. The patterned adhesion layer 310 may be patterned by lithography and etching processes. The patterned adhesion layer 310 includes a first area 312 that it is aligned to at least a portion of the respective device component 214 and a second area 314 where the device component 214 is absent. For example, in the first area 312, the patterned adhesion layer 310 fully covers the respective device component 214 and extends to the substrate 210. For another example, in the first area 312, the patterned adhesion layer 310 is formed aligning with the respective device component 214 without extending to the substrate 210. The second area 314 is located with a distance (d) from the first area 312.

Figure 4:
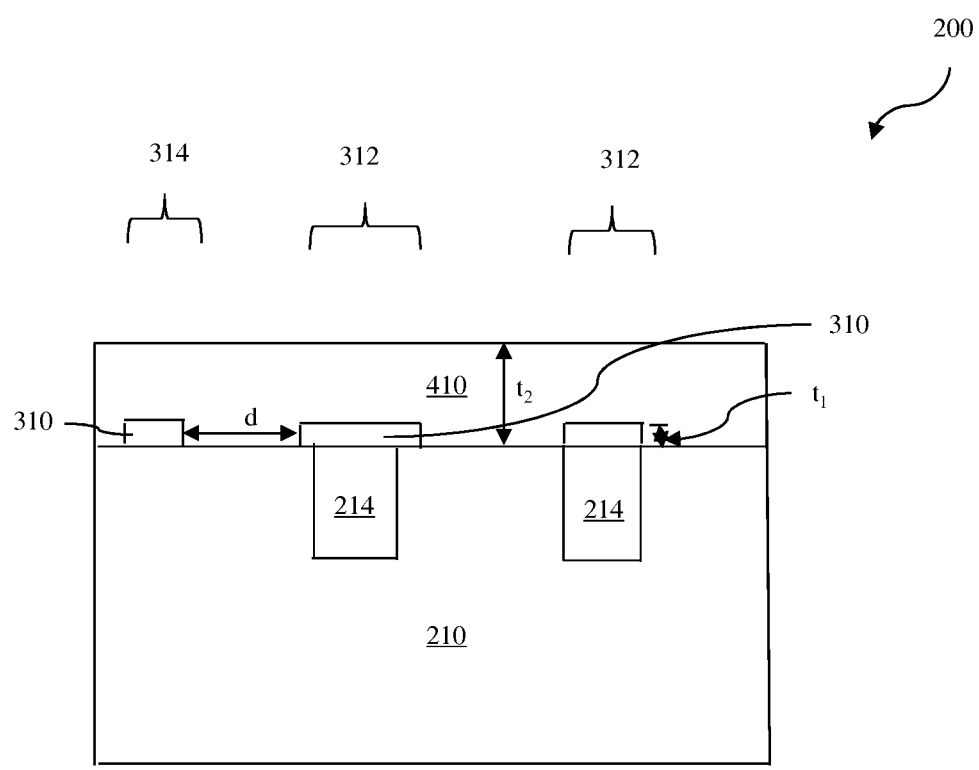

Referring to FIGS. 1 and 4, the method 100 proceeds to step 106 by depositing a metal layer 410 with a second thickness ($t_2$) over substrate 210, and above the patterned adhesion layer 310. The metal layer 410 includes metals, as well as metal alloys, with high surface energy, such as copper (Cu), tin (Sn), silver (Ag), gold (Au), palladium (Pd), platinum (Pt), rhenium (Re), iridium (Ir), ruthenium (Ru), osmium (Os), copper manganese (CuMn), copper aluminum (CuAl), copper titanium, (CuTi), copper vanadium (CuV), copper chromium (CuCr), copper silicon (CuSi), copper niobium (CuNb), or other suitable metals. The metal 410 may be deposited by PVD, CVD, ALD, electrochemical plating (ECP), or other suitable processes.

Figure 5:
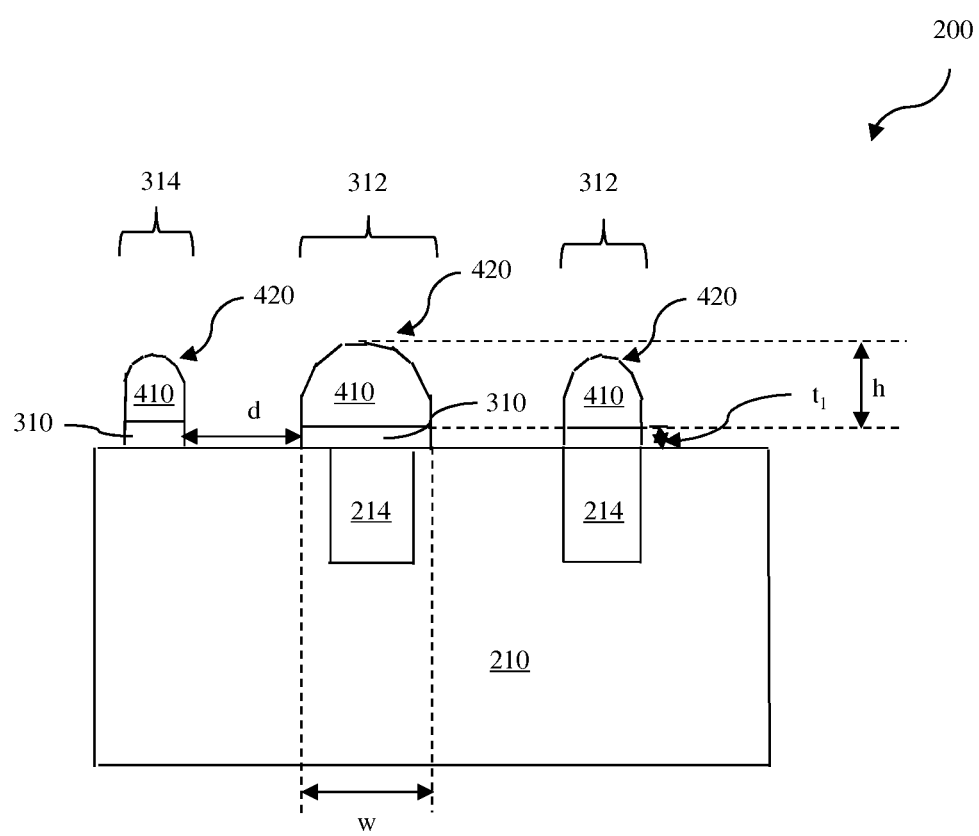

Referring to FIGS. 1 and 5, the method 100 proceeds to step 108 by applying an elevated temperature thermal process to agglomerate the metal layer 410 and form self-forming metal features (SFMF) 420 on the patterned adhesion layer 310, with a width w and a height h. During the thermal process, voids start to be formed in the metal layer 410 in an area where the patterned adhesion layer 310 is absent, followed by the growth of these voids as fractals. Finally the metal layer 410 is fully agglomerated to form the SFMFs 420 on top of the patterned adhesion layer 310. As seen from a top view, a shape of the SFMF 420 is substantially the same as a shape of the respective patterned adhesion layer 310. A top portion of a SFMF 420 is observed to have an irregular agglomerated surface. In the present embodiment, the width w of the SFMF 420 is defined by the patterned adhesion layer 310 and the height h is formed as a result of a combination of a thickness of the metal layer 410 and the width w. A shape of the top portion of the irregular agglomerated surface of the SFMF 420 may be substantially different corresponding to a different ratio of w to h. For example, it is observed that the higher of the ration (w/h), the more flat in a center and more round in edges of the top portion of the agglomerated surface.

In the present embodiment, a set of predetermined targets of the first thickness ($t_1$) of the patterned adhesion layer 310, the distance (d) between the first and second areas, 312 and 314, of the patterned adhesion layer 310, the second thickness ($t_2$) of the metal layer 410 and the temperature of the thermal process is configured to achieve forming the SFMF 420 over the patterned adhesion layer 310. The metal layer 410 is fully segregated in the area where the patterned adhesion layer 310 is absent. As an example, the first thickness ($t_1$) of the Co patterned adhesion layer 310 is in a range from 5 Å to 15 Å and the second thickness ($t_2$) of the Cu layer 410 is in a range from 10 Å to 500 Å. The temperature of the thermal process is in a range from 200° C. to 700° C. As another example, the Co patterned adhesion layer is deposited with a thickness in a range from 5 Å to 20 Å, and the Cu layer is deposited on the Co patterned adhesion layer with a thickness in a range from 50 Å to 200 Å. The thermal process is applied to the Cu layer with a temperature in a range from 350° C. to 500° C. In one embodiment, the second area 314 of the patterned adhesion layer 310 is designed for forming a dummy SFMF in a low metal feature density area.

In one embodiment, the SFMF 420 formed in the first area 312 is configured to provide vertical connection between device components in the substrate and metal lines of different metal layers, while the SFMF 420 formed in the second area 314 to provide a horizontal electrical routing in a same metal layer.

Figure 6:
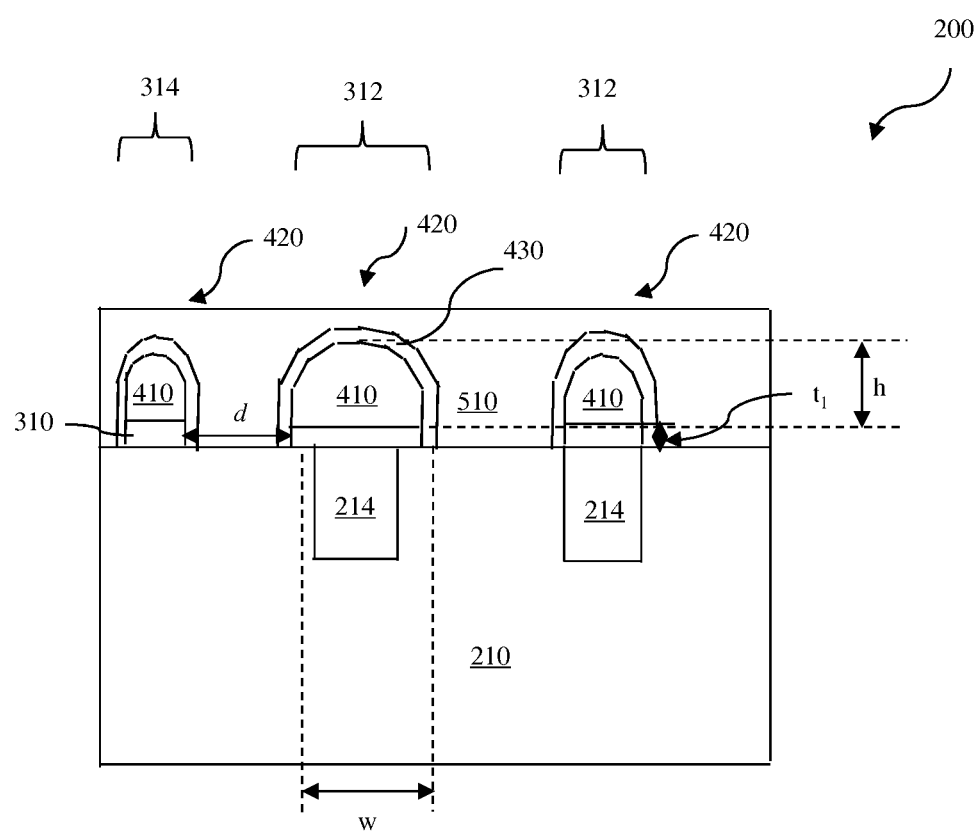

Referring to FIGS. 1 and 6, the method 100 proceeds to step 110 by depositing a dielectric layer 510 between SFMFs 420 to isolate each SFMF 420 from each other. The dielectric layer 510 includes dielectric materials, such as silicon oxide, silicon nitride, a dielectric material having a dielectric constant (k) lower than thermal silicon oxide (therefore referred to as low-k dielectric material layer), or other suitable dielectric material layer. In various examples, the low k dielectric material may include fluorinated silica glass (FSG), carbon doped silicon oxide, amorphous fluorinated carbon, Parylene, BCB (bis-benzocyclobutenes), SiLK (Dow Chemical, Midland, Mich.), polyimide, and/or other materials as examples. In another example, the low k dielectric material may include an extreme low k (XLK) dielectric material. A process of forming the dielectric layer 510 may utilize spin-on coating or CVD.

In one embodiment, a barrier layer 430 is deposited on the SFMF 420 prior to depositing the dielectric layer 510. The barrier layer 430 may include tantalum (Ta), titanium (Ti), manganese (Mn), cobalt (Co), ruthenium (ru), titanium nitride (TiN), tantalum nitride (TaN), tungsten nitride (WN), titanium silicon nitride (TiSiN), tantalum silicon nitride (TaSiN), manganese oxide (MnO), aluminium nitride, aluminium oxide, or other suitable materials. The barrier layer 430 may be deposited by PVD, CVD, ALD, or other suitable processes.

Additionally, a CMP process is performed to remove excessive dielectric layer 510. In one embodiment, the CMP removes a portion of top portion of the SFMF 420 and planarize the top surface of the dielectric layer 510 with the top surface of the SFMF 420.

Additional steps can be provided before, during, and after the method 100, and some of the steps described can be replaced, eliminated, or moved around for additional embodiments of the method 100. As an example, steps 104 to 110 are repeated to form new metal/dielectric interconnections.

Based on the above, the present disclosure offers methods for fabricating IC device. The method employs forming a metal line by agglomerating high surface energy metal and patterning the metal line by using adhesion differentiation with a patterned adhesion layer during the agglomeration. The method provides a metal line formation by deposition and thermal process. The method demonstrates a robust metal line formation for small dimension.

The present disclosure provides many different embodiments of fabricating a semiconductor IC that provide one or more improvements over other existing approaches. In one embodiment, a method for fabricating a semiconductor integrated circuit (IC) includes providing a providing a substrate, forming a patterned adhesion layer over the substrate, depositing a metal layer on the patterned adhesion layer, applying a thermal process to agglomerate the metal layer to form a self-forming-metal-feature (SFMF) over the patterned adhesion layer. A top portion of the SFMF has an irregular agglomerated surface. The method also includes and depositing a dielectric layer between SFMFs.

In another embodiment, a method for fabricating a semiconductor IC includes providing a substrate having conductive features, forming a patterned adhesion layer over the substrate. The patterned adhesion layer has a first area which aligns to, at least, a portion of the respective conductive feature. The method also includes depositing a metal layer on the patterned adhesion layer, applying a thermal process to agglomerate the metal layer to form a self-forming-metal-feature (SFMF) over the patterned adhesion layer. A top portion of the SFMF has an irregular agglomerated surface. The method also includes depositing a dielectric layer between SFMFs.

In yet another embodiment, a semiconductor device includes a substrate having a device component, a patterned adhesion layer over the substrate. The patterned adhesion layer has a first area where the patterned adhesion layer aligns to at least a portion of the device component and a second area where the device component is absent. The semiconductor device also includes a self-forming-metal-feature (SFMF) formed by metal agglomeration on the patterned adhesion layer, in both of first and second areas, with an irregular agglomerated surface. A top portion of the SFMF has an irregular agglomerated surface. As seen from a top view, the SFMF has a shape that is substantial similar to a shape of the corresponding portion of the patterned adhesion layer. The SFMF is formed with a pattern which is substantial same as the patterned adhesion layer over the substrate. The semiconductor device also includes a dielectric layer between the SFMFs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor integrated circuit (IC), the method comprising:
    providing a substrate;
    forming a patterned adhesion layer over the substrate;
    depositing a metal layer over the patterned adhesion layer and the substrate;
    applying a thermal process to form voids in the metal layer over areas of the substrate absent the patterned adhesion layer and agglomerate the metal layer over areas of the substrate with the patterned adhesion layer to form a self-forming-metal-feature (SFMF) on the patterned adhesion layer, wherein a top portion of the SFMF has an irregular agglomerated surface; and
    depositing a dielectric layer over the SFMF.

2. The method of claim 1, wherein the patterned adhesion layer includes one or more materials from the group consisting of cobalt (Co), ruthenium (Ru), manganese (Mn), tantalum (Ta), tantalum nitride (TaN), titanium (Ti), titanium nitride (TiN), tungsten (W) and alloys of these materials.

3. The method of claim 1, wherein the patterned adhesion layer has a thickness in a range from about 3 Å to about 100 Å.

4. The method of claim 1, wherein the patterned adhesion layer includes Co with a thickness in a range from about 5 Å to about 20 Å.

5. The method of claim 1, wherein the metal layer includes one or more materials from the group consisting of copper (Cu), tin (Sn), silver (Ag), gold (Au), palladium (Pd), platinum (Pt), rhenium (Re), iridium (Ir), ruthenium (Ru), osmium (Os), copper manganese (CuMn), copper aluminum (CuAl), copper titanium, (CuTi), copper vanadium (CuV), copper chromium (CuCr), copper silicon (CuSi) and copper niobium (CuNb).

6. The method of claim 1, wherein the metal layer has a thickness in a range from about 10 Å to about 500 Å.

7. The method of claim 1, wherein the metal layer includes Cu with a thickness in a range from about 50 Å to about 200 Å.

8. The method of claim 1, wherein the thermal process is applied with a temperature range from about 200° C. to about 700° C.

9. The method of claim 1, wherein the thermal process is applied to the metal layer with a temperature in a range from about 350° C. to 500° C.

10. The method of claim 1, wherein as seen from a top view, the SFMF is formed with a shape that is substantially the same as a shape of the respective patterned adhesion layer over the substrate.

11. The method of claim 1, further comprising:
    depositing a barrier layer prior to depositing the dielectric layer.

12. The method of claim 1, wherein the dielectric layer includes low-k material.

13. A method for fabricating a semiconductor integrated circuit (IC), the method comprising:
    providing a substrate having conductive features;
    forming a patterned adhesion layer over the substrate, wherein the patterned adhesion layer has a first area which aligns to at least a portion of the respective conductive feature and a second area where the conductive feature is absent;

depositing a metal layer to cover the patterned adhesion layer;

applying a thermal process to form voids in the metal layer over areas of the substrate absent the patterned adhesion layer and agglomerate the metal layer over areas of the substrate with the patterned adhesion layer to form a self-forming-metal-feature (SFMF) over the patterned adhesion layer, wherein a top portion of the SFMF has an irregular agglomerated surface; and depositing a dielectric layer next to the SFMF.

14. The method of claim 13, wherein the patterned adhesion layer includes one or more materials from the group consisting of cobalt (Co), ruthenium (Ru), manganese (Mn), tantalum (Ta), tantalum nitride (TaN), titanium (Ti), titanium nitride (TiN), tungsten (W) and alloys of these materials.

15. The method of claim 13, wherein the patterned adhesion layer has a thickness in a range from about 3 Å to about 100 Å.

16. The method of claim 13, wherein the metal layer includes one or more materials from the group consisting of copper (Cu), tin (Sn), silver (Ag), gold (Au), palladium (Pd), platinum (Pt), rhenium (Re), iridium (Ir), ruthenium (Ru), osmium (Os), copper manganese (CuMn), copper aluminum (CuAl), copper titanium, (CuTi), copper vanadium (CuV), copper chromium (CuCr), copper silicon (CuSi) and copper niobium (CuNb).

17. The method of claim 13, wherein as seen from a top view, the SFMF has a shape that is substantially the same as the respective patterned adhesion layer.

18. The method of claim 13, wherein the thermal process is applied with a temperature range from about 200° C. to about 700° C.

19. A method for fabricating a semiconductor integrated circuit (IC), the method comprising:

providing a substrate;

forming a patterned adhesion layer with a first thickness over the substrate;

depositing a metal layer with a second thickness over the patterned adhesion layer and the substrate;

applying a thermal process to form voids in the metal layer over areas of the substrate absent the patterned adhesion layer and agglomerate the metal layer over areas of the substrate with the patterned adhesion layer to form a self-forming-metal-feature (SFMF) on the patterned adhesion layer, wherein a top portion of the SFMF has an irregular agglomerated surface; and depositing a dielectric layer over the SFMF.

20. The method of claim 19, further comprising performing a chemical mechanical planarization (CMP) to planarize a top surface of the dielectric layer and a top surface of the SFMF.

* * * * *